(12) United States Patent
Yamazaki et al.

(10) Patent No.: US 7,063,869 B2
(45) Date of Patent: Jun. 20, 2006

(54) PRINTING DEVICE AND METHOD OF MANUFACTURING A LIGHT EMITTING DEVICE

(75) Inventors: Shunpei Yamazaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 96 days.

(21) Appl. No.: 10/171,516

(22) Filed: Jun. 14, 2002

(65) Prior Publication Data

US 2003/0010283 A1 Jan. 16, 2003

(30) Foreign Application Priority Data

Jun. 15, 2001 (JP) ............................. 2001-182657

(51) Int. Cl.
  *B05D 5/06* (2006.01)
  *B05D 5/12* (2006.01)
(52) U.S. Cl. ............................. 427/66; 427/68; 347/68
(58) Field of Classification Search .................. 427/66, 427/68; 347/68
  See application file for complete search history.

(56) References Cited

U.S. PATENT DOCUMENTS

| | | | |
|---|---|---|---|
| 5,557,304 A * | 9/1996 | Stortz | 347/15 |
| 6,146,716 A * | 11/2000 | Narang | 427/559 |
| 6,169,163 B1 * | 1/2001 | Woo et al. | 528/397 |
| 6,623,097 B1 * | 9/2003 | Okada et al. | 347/21 |
| 6,680,578 B1 * | 1/2004 | Antoniadis et al. | 315/169.3 |
| 2001/0004469 A1 * | 6/2001 | Himeshima et al. | 427/66 |
| 2003/0054186 A1 * | 3/2003 | Miyashita et al. | 428/500 |

FOREIGN PATENT DOCUMENTS

| | | | |
|---|---|---|---|
| JP | 10-012377 A | | 1/1998 |
| JP | 10-153967 A | | 6/1998 |
| JP | 11-054270 A | | 2/1999 |
| WO | WO98/24271 | * | 6/1998 |
| WO | WO99/20080 | * | 4/1999 |

OTHER PUBLICATIONS

U.S. Appl. No.: 09/680,492 filed: Oct. 16, 2000 is being filed as related application (Title: Electro-Optical Device and Manufacturing Method Thereof).

* cited by examiner

*Primary Examiner*—Michael Cleveland
(74) *Attorney, Agent, or Firm*—Nixon Peabody LLP; Jeffrey L. Costellia

(57) ABSTRACT

A first pressure generating chamber, which is sealed by a first elastic plate mounted with a first piezoelectric element at one surface, and a second pressure generating chamber, which is sealed by a second elastic plate mounted with a second piezoelectric element at one surface are formed in a casing. The second pressure generating chamber is formed with an opening which is a discharge port. A mixture is discharged from the discharge port. A nozzle formed with an opening jets gas toward a substrate surface, and is provided in the vicinity of the discharge port of the ink head.

10 Claims, 16 Drawing Sheets

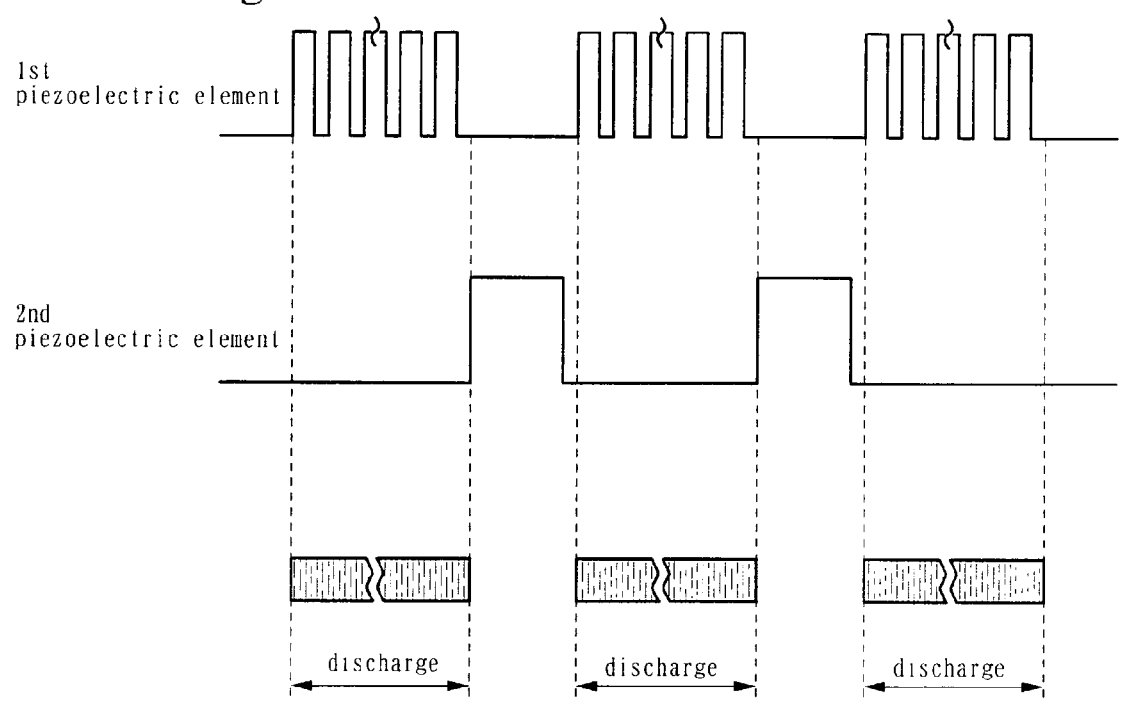

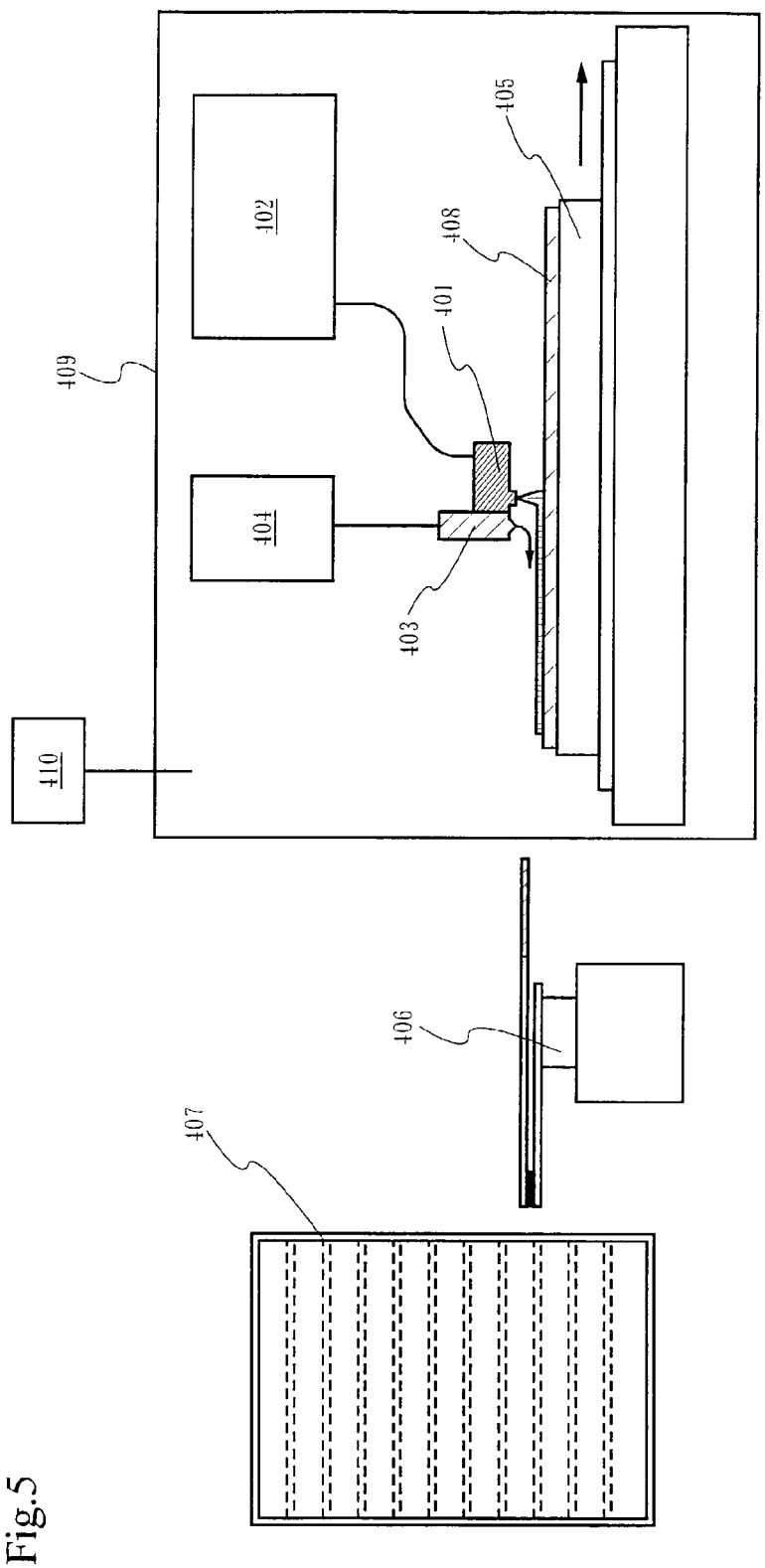

PRINTING DEVICE AND METHOD OF MANUFACTURING A LIGHT EMITTING DEVICE

BACKGROUND OF THE INVENTION

1. Field of the Invention

The present invention relates to a method of manufacturing a light emitting device which has a light emitting element in which an emitter composed of an organic compound is provided between a pair of electrodes, and to a printing device which is applicable to the manufacture of the light emitting device.

2. Description of the Related Art

A light emitting element in which an organic compound is used for an emitter (hereinafter referred to as organic light emitting element) generally has a sandwich structure in which an organic compound layer is formed between a cathode and an anode. In case of using a low molecular weight organic compound, the structure is formed by combining layers such as a hole injecting layer, a hole transporting layer, a light emitting layer, an electron transporting layer and an electron injecting layer, which are composed of respective materials. The hole injecting layer and the hole transporting layer are not necessarily strictly distinguished, and the hole transporting property (hole mobility) is a particularly important characteristic for both the layers. For the sake of convenience, the hole injecting layer corresponds to a layer that contacts an anode, and a layer that contacts the hole injection layer is called the hole transporting layer. Thus, both the layers are distinguished from each other. Also, a layer that contacts a cathode is called the electron injecting layer, and a layer that contacts the electron injecting layer is called the electron transporting layer. The light emitting layer may also serve as the electron transporting layer, and thus, is also called a light emitting electron transporting layer. A vacuum evaporation method is adopted for forming a layer composed of the low molecular weight organic compound.

On the contrary, a polymer organic compound material is formed by a wet method such as an application method or a printing method. Recently, an ink jet printing method has attracted attention, and the technique is disclosed in JP 10-12377 A, JP 10-153967 A, JP 11-54270 A, and the like. As the organic compound material used in the ink jet method, a water-soluble, or alcohol or glycol-soluble material is applied, and a precursor of polyparaphenylene vinylene (hereinafter referred to as PPV) or the like is used therefor. The PPV precursor becomes salt and dissolves in water, and is polymerized to become a high polymer by heating after application.

A light emitting mechanism in the above-mentioned organic compounds is regarded as a phenomenon in which: an electron injected from a cathode and a hole injected from an anode recombine in a light emitting layer composed of an emitter to form a molecular excision; and light is emitter when the molecular excision returns to a base state. There are light emission from a singlet excitation state (fluorescence) and light emission from a triplet excitation state (phosphorescence). A luminance ranges from several thousands to several tens of thousands $cd/m^2$. Thus, it is considered that the light emitting mechanism can be sufficiently applied to a display device and the like in principle.

It is impossible in terms of heat-resistance or water-resistance that an organic compound layer is formed by patterning with an exposure process like semiconductor. The organic compound layer is formed by patterning with a shadow mask in a vacuum evaporation method. In this case, an organic compound material attached to the shadow mask is not utilized and lost. Besides, the organic compound material that remains on an inner wall of a chamber of an evaporation device and in a crucible of an evaporation source becomes a loss. Thus, the utilization efficiency is expected to be approximately 10%. Therefore, the low molecular weight organic compound layer formed by the vacuum evaporation method has involved a problem in that the utilization efficiency of the material is poor.

Of course, it may be sufficient that the material cost is low. However, the low molecular weight organic compound material needed to have higher purity is expensive, which is reflected in the cost of a product.

On the other hand, when an organic light emitting element is formed by the ink jet method using a polymer organic compound, there is an advantage that the patterning formation step is simple and easy. An organic compound layer is formed for each dot, whereby the steps such as photoresist patterning and etching are not required. Further, the utilization efficiency of the material by far increases, and it becomes possible to secure the utilization efficiency of 80% or more.

However, as a multiple production method in which a plurality of display panels are taken out from one large-area substrate, it can not be said that the ink jet method in which a mixture is dropped each dot has always high capacity as an effective production method. The ink jet method has involved a problem in that a processing time increases after all since higher accuracy of position and higher processing speed are demanded as a screen size becomes larger and the number of pixels increases.

Further, in the case where the organic compound layer is formed by dropping the mixture every dot, variation in a discharge amount of the mixture and fluctuation of a drop position lead to unevenness in emission intensity, which causes degradation of quality of a light emitting device constituted of a large number of light emitting elements.

SUMMARY OF THE INVENTION

The present invention has been made in view of the above-described problems, and an object of the present invention is therefore to provide a printing device which is capable of conducting formation of an organic compound layer by an ink jet method in a simple and easy manner and at high speed, and to provide a method of manufacturing a light emitting device using the printing device.

In order to solve the above-described problems, a printing device according to an aspect of the present invention is characterized in the structure of an ink head and includes an ink head which has: a first elastic plate mounted with a first piezoelectric element, a second elastic plate mounted with a second piezoelectric element; a pressure generating chamber sealed by the first elastic plate at one surface; and a supply path connected with the pressure generating chamber and sealed by the second elastic plate at one surface, and means for leveling a mixture discharged from the ink head by jet of gas, wherein the first piezoelectric element is operated at a higher oscillation frequency than that of the second piezoelectric element to continuously discharge the mixture.

According to another aspect of the present invention, there is provided a printing device including an ink head which has: a first elastic plate mounted with a first piezoelectric element; a second elastic plate mounted with a second piezoelectric element; a pressure generating chamber sealed by the first elastic plate at one surface; and a supply path connected with the pressure generating chamber and sealed by the second elastic plate at one surface; and means for leveling a mixture discharged from the ink head by jet of gas, wherein the device is provided with a function of continuously discharging the mixture by the first elastic plate mounted with the first piezoelectric element and stopping the discharge of the mixture by the second elastic plate mounted with the second piezoelectric element.

A solution in which an organic light emitting material or a precursor thereof is dissolved or dispersed in a liquid is used as the mixture. The mixture is discharged continuously, whereby the time for position control is shortened and the printing speed can be increased in comparison with an ink jet method in which ink is printed for each dot. In particular, the present invention is appropriately applied to a production method using mother glass, in which a plurality of display panels are taken out from a large-area substrate. Further, in the case where a plurality of pixel regions are provided in the mother glass, the discharge of the mixture is stopped instantaneously during a movement of the ink head between the pixel regions, whereby the ink head can be moved at higher speed to the mother glass. The second piezoelectric element is provided in order to stop the discharge of the mixture instantaneously, whereby the high speed in printing can be realized.

A method of manufacturing a light emitting device, that uses the ink jet printing device with the above-described structure, includes: a first stage of forming a stripe-shaped organic compound layer in a pixel region by continuously dropping a mixture from an ink head due to vibration of a first piezoelectric element; and a second stage of stopping the vibration of the first piezoelectric element and instantaneously stopping the drop of the mixture by a second piezoelectric element. In this case, a stripe-shaped organic compound layer may be formed in a pixel region by applying the mixture and spraying gas to the application surface for leveling of the surface.

According to another aspect of the present invention, there is provided a method of manufacturing a light emitting device for forming an organic compound layer by an ink jet method on a substrate in which first to n-th (n>1) pixel regions are defined, including: a first stage of forming a stripe-shaped organic compound layer in the first pixel region by continuously dropping a mixture from an ink head due to vibration of a first piezoelectric element; and a second stage of stopping the vibration of the first piezoelectric element, instantaneously stopping the drop of the mixture by a second piezoelectric element, and moving the ink head to the second pixel region. In this way, stripe-shaped organic compound layers are formed in the first to n-th pixel regions. Further, in this case as well, a stripe-shaped organic compound layer may be formed in a pixel region by applying the mixture and spraying a gas to the application surface for leveling of the surface In the above-described method of manufacturing a light emitting device, a first organic compound layer may be formed by an application method, and then, a second organic compound layer may be formed by an ink jet printing method. The first organic compound layer may be formed from polyethylene dioxythiophene or the like.

The first and second piezoelectric elements are incorporated into the ink head, and the timings for causing displacement are synchronized, whereby the mixture can be discharged continuously, or the discharge can be stopped instantaneously. The mixture is discharged continuously to form an organic compound layer. Thus, the time for position control is shortened, and the printing speed can be increased in comparison with an ink jet method in which ink is printed for each dot. In particular, the present invention is appropriately applied to a production method in which a plurality of display panels are taken out from a large-area substrate. Further, in the case where a plurality of pixel regions are provided in the large-area substrate, the discharge of the mixture is stopped instantaneously during a movement of the ink head between the pixel regions, whereby the ink head can be moved at higher speed to the large-area substrate. The second piezoelectric element is provided in order to stop the discharge of the mixture instantaneously. This means is provided, whereby the high speed in printing can be realized.

BRIEF DESCRIPTION OF THE DRAWINGS

In the accompanying drawings:

FIG. 4 is a diagram explaining an operation timing of a piezoelectric element;

FIG. 5 is a diagram explaining a structure of an ink jet method printing device according to the present invention;

DETAILED DESCRIPTION OF THE PREFERRED EMBODIMENTS

Figure 1:
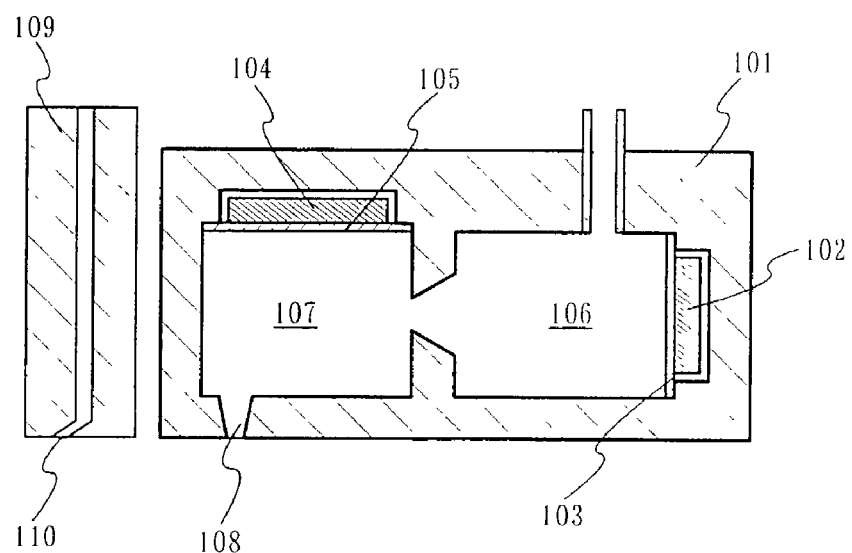
FIG. 1 is a sectional view explaining a structure of an ink head of the present invention.

Hereinafter, an embodiment mode of the present invention is described with reference to the accompanying drawings. FIG. 5 shows a structure of a printing device using an ink jet method according to the present invention. The printing device is constituted of an ink head 401, a nozzle 403 for spraying gas, a stage 405 for fixing a substrate, and the like. In addition, subordinate elements such as a cassette 407 for holding a substrate to be processed and a conveying means 406 for bringing in and carrying out the substrate from the cassette 407 may be provided. A mixture is supplied to the ink head 401 from a reservoir tank 402. Further, the gas to be sprayed is supplied from a gas supply means 404 constituted of a compression container, a filter, a flow control device, and the like. An inert gas is used as the gas, and nitrogen, argon or the like is applied thereto.

The nozzle 403 for spraying gas is provided adjacently to the ink head 401. The gas sprayed from the nozzle is used for leveling the mixture discharged onto a substrate 408.

Most of mixtures are easy to be oxidized. Thus, it is desirable that the inert gas such as nitrogen is supplied to the inside of a processing chamber 409 by a gas supply means 410 and that the atmosphere in the processing chamber 409 is substituted.

FIG. 1 is a sectional view of a structure of the ink head. In a casing 101, a first pressure generating chamber 106 which is sealed by a first elastic plate 103 mounted with a first piezoelectric element 102 at one surface, and a second pressure generating chamber 107 which is sealed by a second elastic plate 105 mounted with a second piezoelectric element 104, are formed. The second pressure generating chamber 107 is formed with an opening, which is a discharge port 108 for discharging a mixture. A nozzle 109 formed with all opening 110 jets a gas toward a substrate surface, and is provided in the vicinity of the discharge port 108 of the ink head.

The first elastic plate 103 constituting the first pressure generating chamber 106 varies the volume of the first pressure generating chamber 106 due to bending displacement of the first piezoelectric element 102 to thereby discharge the mixture. On the other hand, the second elastic plate 105 of the second pressure generating chamber 107 also varies the volume of the second pressure generating chamber 107 due to the bending displacement of the second piezoelectric element 104 to thereby stop the discharge of the mixture.

Figure 3A:
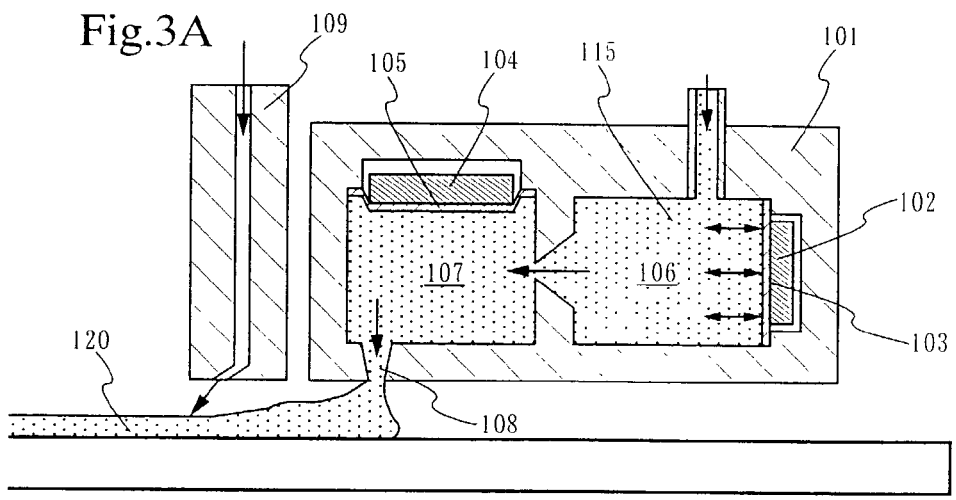
FIGS. 3A and 3B are sectional views explaining structures and an operation of the ink head of the present invention.
Figure 3B:
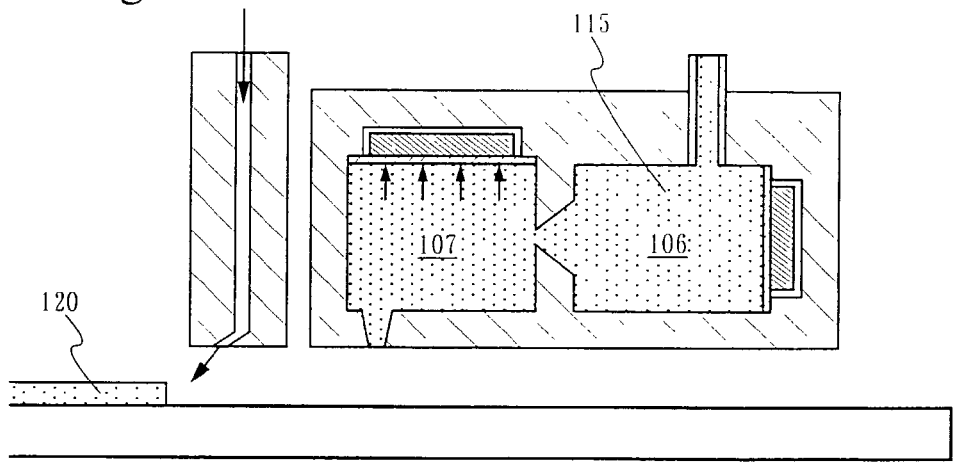

FIGS. 3A and 3B are diagrams explaining an operation for discharging the mixture from the ink head. The volume of the first pressure generating chamber 106 is varied due to vibration of the first piezoelectric element 102 and the mixture is discharged from the discharge port 108 through the second pressure generating chamber 107. Along with this, a mixture 115 is supplied timely from a reservoir. At this time, the second piezoelectric element 104 does not vibrate but remains at a fixed position. To stop the discharge of the mixture 120, the vibration of the first piezoelectric element 102 is stopped, and the second piezoelectric element 104 of the second pressure generating chamber 107 is displaced so that the volume of the second pressure generating chamber 107 becomes larger. With the displacement of the second piezoelectric element 104, the elastic plate 105 is displaced, and thus, the volume of the second pressure generating chamber 107 can be made larger. Thus, the discharge of the mixture can be instantaneously stopped.

FIG. 4 is a timing chart of a signal voltage applied to the piezoelectric element. A pulse voltage is imparted to the first piezoelectric element in a short cycle, whereby the mixture is continuously discharged. The discharge is conducted for a predetermined period, and the pulse voltage is stopped at the time of stopping the discharge. At the same time, a pulse voltage is applied to the second piezoelectric element to cause displacement, and the discharge is instantaneously stopped.

In this way, the two piezoelectric elements are incorporated into the ink head, and the timings for causing displacement are synchronized as shown in FIG. 4, whereby the mixture can be discharged continuously, or the discharge can be stopped instantaneously.

Figure 2:
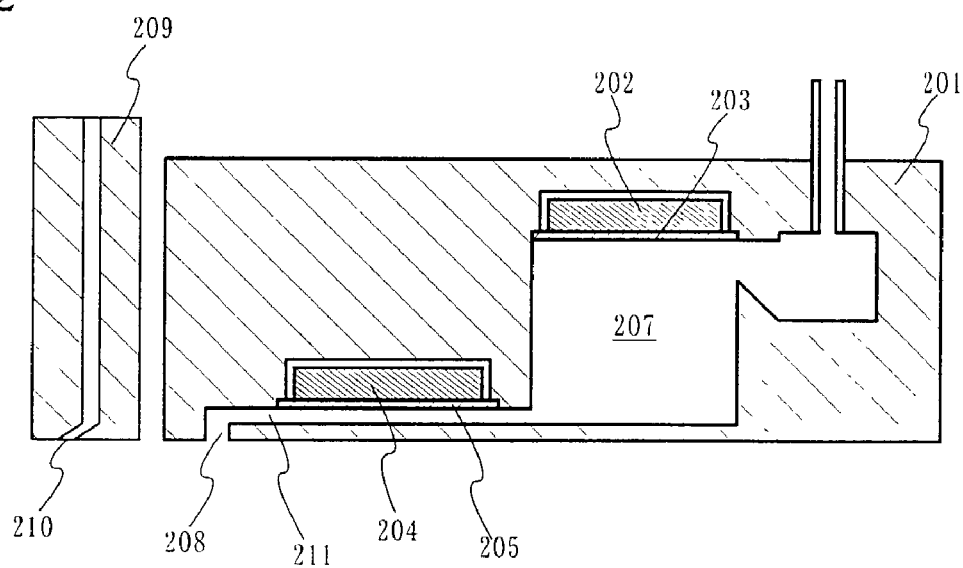
FIG. 2 is a sectional view explaining a structure of an ink head of the present invention.

FIG. 2 shows another example of an ink head. This ink head has a structure in which a first piezoelectric element 202, a first elastic plate 203, a second piezoelectric element 204, and a second elastic plate 205 are provided in a casing 201, and the ink head can discharge the mixture continuously or stop the discharge instantaneously as in the above-described ink head. Note that the second piezoelectric element 204 and the second elastic plate 205 are provided on the midway of a supply path 211 that extends from a pressure generating chamber 207. This structure has a mechanism in which the supply path 211 is closed due to the displacement of the second piezoelectric element 204 to stop the discharge of the mixture from a discharge port 108. In addition, a nozzle 209 for jetting gas has the same structure as that in FIG. 1.

One discharge port may be provided to the ink head. Also, a plurality of discharge ports may be provided in order to conduct printing more effectively. For example, a pair of pressure generating chambers and a discharge port may be provided as one pair. Also, a pair of pressure generating chambers may be provided to a plurality of discharge ports.

The first and second piezoelectric elements are incorporated into the ink head, and the timings for causing displacement are synchronized, whereby the mixture can be discharged continuously, or the discharge can be stopped instantaneously. As shown in FIG. 4, the first piezoelectric element and the second piezoelectric element are synchronized to cause the mixture to be discharged continuously and form an organic compound layer. Thus, time for position control is shortened, and the printing speed can be increased. In particular, the present invention is appropriately applied to a production method in which a plurality of display panels are taken out from a large-area substrate. Further, in the case where a plurality of pixel regions are provided in the large-area substrate, the discharge of the mixture is stopped instantaneously during a movement of the ink head between the pixel regions, whereby the ink head can be moved at higher speed to the large-area substrate. The second piezoelectric element is provided in order to stop the discharge of the mixture instantaneously, whereby the high speed in printing can be realized.

Embodiment 1

Figure 6:
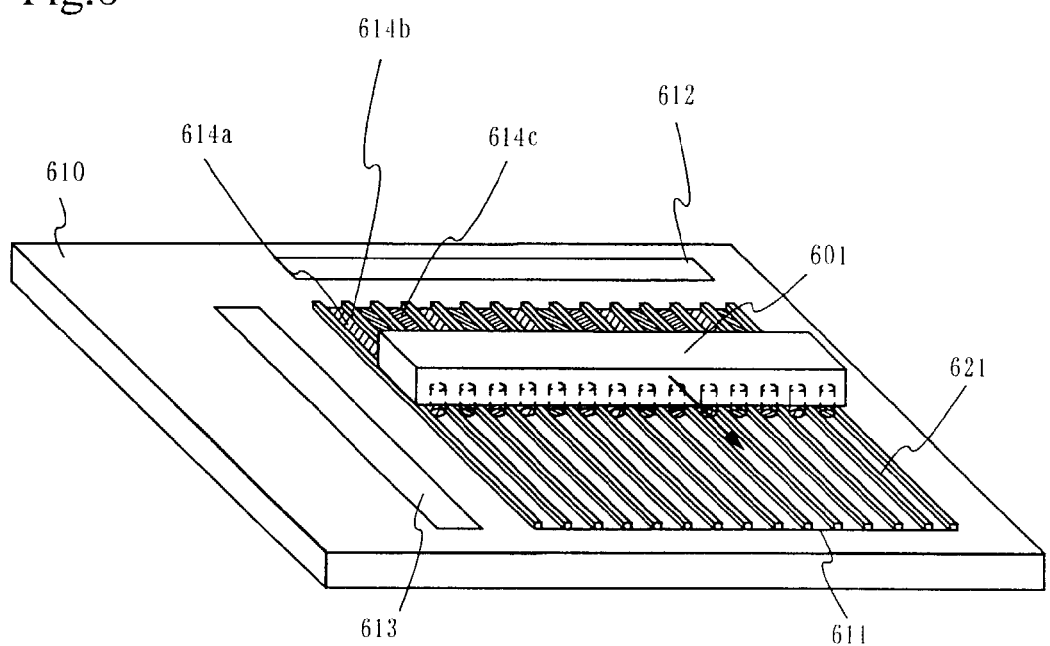
FIG. 6 is a diagram explaining a printing step of an organic compound layer to a substrate having a pixel region.

FIG. 6 schematically shows a state that a polymer organic compound layer is formed so as to match with a pixel region on a substrate in which one electrode of an organic light emitting clement by using an ink jet printing device according to the present invention. In FIG. 6, reference numeral 610 indicates a substrate, and a pixel region 611, a source side driver circuit 612 and a gate side driver circuit 613 are formed by using TFTs on the substrate 610. The pixel region corresponds to the region surrounded by a plurality of source wirings connected to the source side driver circuit 612 and a plurality of gate wirings connected to the gate side driver circuit 613. A TFT and an organic light emitting element electrically connected with the TFT are formed in the pixel region. The pixel region 611 is defined as the above-described region in which pixels are arranged in matrix.

Here, reference symbol 614a indicates a mixture of an organic compound material for emitting red light and a solvent (hereinafter, referred to as mixture for a red light emitting layer), reference symbol 614b indicates a mixture of an organic compound material for emitting green light and a solvent (hereinafter, referred to as mixture for a green light emitting layer), and reference numeral 614c indicates a mixture of an organic compound material for emitting blue light and a solvent (hereinafter, referred to as mixture for a blue light emitting layer). Incidentally, there are given two methods: a method in which a polymerized polymer organic compound material is directly dissolved in a solvent for application; and a method in which a precursor dissolved in a solvent is deposited into a film and then the film is subjected to thermal polymerization. Both the methods may be adopted.

The mixture for a red light emitting layer 614a, the mixture for a green light emitting layer 614b, and the mixture for a blue light emitting layer 614c are separately discharged from an ink head, and are applied in a direction indicated by an arrow. That is, stripe-shaped light emitting layers are formed simultaneously for organic compound layers for emitting red light; organic compound layers for emitting green light; and organic compound layers for emitting blue light.

As the polymer organic compound for forming the organic compound layer, a substance which is soluble in an organic solvent, such as a polyparaphenylene vinylene derivative, a polythiophene derivative, a polyfluorene derivative, a polyparaphenylene derivative, a polyalkylphenytene derivative or a polyacetylene derivative, can be used.

As the polyparaphenylene vinylene derivative, poly(2,5-dialkoxy-1,4-phenylenevinylene): RO-PPV can be used. Specifically, materials such as poly(2-methoxy-5-(2-ethylhexoxy)-1, 4-phenylenevinylene): MEH-PPV and poly(2,5-dimethyloctylsilyl-1,4-phenylenevinylene): DMOS-PPV can be used.

As the polyparaphenylene derivative, poly(2,5-dialkoxy-1,4-phenylene): RO-PPP can be used.

As the polythiophene derivative, poly(3-alkylthiophene): PAT can be used. Specifically, materials such as poly(3-hexylthiophene): PHT, poly(3-cyclohexylthiophene): PCHT can be used. In addition, poly(3-cyclohexyl-4-methylthiophene): PCHMT, poly(3-[4-octylphenyl]-2, 2'bithiophene): PTOPT, poly(3-(4-octylphenyl)-thiophene): POPT-1 and the like can be used.

As the polyfluorene derivative, poly(dialkylfluorene): PDAF can be used. Specifically, materials such as poly (dioctylfluorene): PODF can be used.

As the polyacetylene derivative, materials such as polypropylphenylacetylene: PPA-iPr, polybutylphenylacetylene: PDPA-nBu, and polyhexylphenylacetylene: PHPA can be used.

Further, examples of a solvent for the above polymer organic compound include toluene, benzene, chlorobenzene, dichlorobenzene, chloroform, tetralin, xylene, anisole, dichloromethane, ā-butyrolactone, butylcellosolve, cyclohexane, NMP (N-methyl-2-pyrrolidone), dimethyl sulfoxide, cyclohexanone, dioxane and THF (tetrahydrofuran).

Further, PEDOT (poly(3,4-ethylene dioxythiophene)) or polyaniline (PA) can be used as a hole injecting polymer compound. Incidentally, these materials are water-soluble. The PEDOT can also be formed by an application method. A first organic compound layer (PEDOT) may be formed by the application method, and then, a second organic compound layer may be formed on the first organic compound layer by an ink jet method.

In addition, an aggregate of an organic compound which does not have subliming property or dissolving property (preferably, an aggregate which has molecularity of 10 or less), or an organic compound (referred to as intermediate molecular weight organic compound) which has a molecular chain length of 5 µm or less (preferably 50 nm or less) can be used. An example of such a material is tetrakis(2-mercapto-benzoxazolate)tungsten. In pattern formation by an ink jet method using a polymer organic compound material, there is a problem that a dropped mixture becomes a linear shape like a thread. However, such a defect is not caused in the intermediate molecular weight organic compound in which the number of chain molecules is small. In the case of forming the mixture of the polymer organic compound material, it is necessary to consider a combination of a solvent in which the polymer organic compound material is dissolved and a member constituting an ink head. Actually, it is necessary to use a solvent that does not corrode the member constituting an ink head. However, the intermediate molecular weight organic compound dispersed in an aqueous solution may be used, and thus, does not involve the above-described problem.

Note that the organic compound layer mentioned here indicates pixel rows partitioned by partition walls 621, and the partition walls 621 are formed above the source wirings. That is, the row in which a plurality of pixels are arranged in series along the source wiring is called the organic compound layer. Incidentally, although the case in which the partition walls 621 are formed above the source wirings is explained here, the partition walls 621 may be provided above the gate wirings. In this case, the row in which a plurality of pixels are arranged in series along the gate wiring is called the organic compound layer.

Therefore, the pixel region 611 is regarded as the aggregate of a plurality of organic compound layers partitioned by stripe-shaped partition walls provided above a plurality of source wirings or a plurality of gate wirings. In such a case, it can also be said that the pixel region 611 is composed of the organic compound layer in which a stripe-shaped light emitting layer for emitting red light is formed, the organic compound layer in which a stripe-shaped light emitting layer for emitting green light is formed, and the organic compound layer in which a stripe-shaped light emitting layer for emitting blue light is formed.

Further, since the stripe-shaped partition walls are provided above the plurality of source wirings or the plurality of gate wirings, the pixel region can be substantially regarded as the aggregate of a plurality of organic compound layers divided by the plurality of source wirings or the plurality of gate wirings.

FIG. 6 shows an example in which an organic compound (strictly speaking, mixture) is collectively applied to all the organic compound layers formed in the pixel region. That is, a head portion 601 is attached with the same number of nozzles as the organic compound layers. With this structure, application can be performed to all the organic compound layers with one scanning to improve throughput remarkably.

Further, the pixel region may be divided into a plurality of zones, and the head portion, provided with the same number of nozzles as the organic compound layers included in one zone, may be used. That is, assuming that the pixel region is divided into n zones, the organic compound material (strictly speaking, mixture) can be applied to all the organic compound layers by scanning n times. In actuality, there is a case where a pixel size is small, for example, several tens of µm, and thus, the width of the organic compound layer may be approximately several tens of µm. In such a case, since it is difficult that the nozzles are arranged in a row, it is necessary to contrive the arrangement of the nozzles.

Embodiment 2

Figure 7:
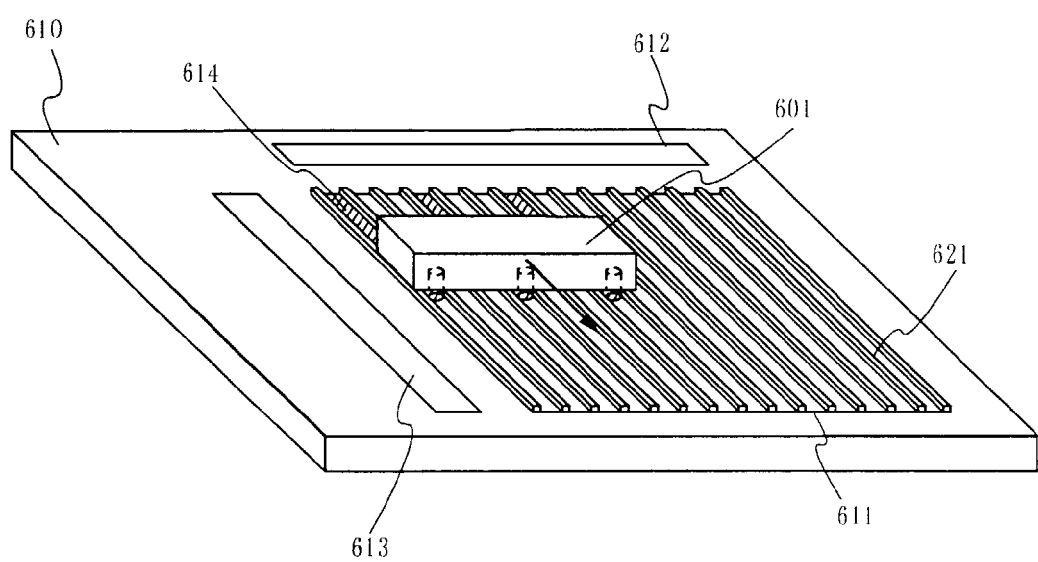
FIG. 7 is a diagram explaining a printing step of an organic compound layer to a substrate having a pixel region.

FIG. 7 schematically shows another example in which a polymer organic compound layer 614 is formed so as to correspond to a pixel region by using an ink jet printing device according to the present invention on a substrate on which one electrode of an organic light emitting element is formed. In FIG. 7, the same parts as those in FIG. 6 are indicated by the common reference numerals, and are not described here. FIG. 7 shows an embodiment in which application is conducted for each color, and one kind of the mixture is discharged from the ink head. In this case, the respective ink heads filled with the mixture for a red light emitting layer, the mixture for a green light emitting layer, and the mixture for a blue light emitting layer are provided, and application is conducted for each of the colors. Therefore, a thickness, a burning polymerization temperature in the later stage, and the like can be adjusted at the optimum level for each color.

Embodiment 3

Figure 8:
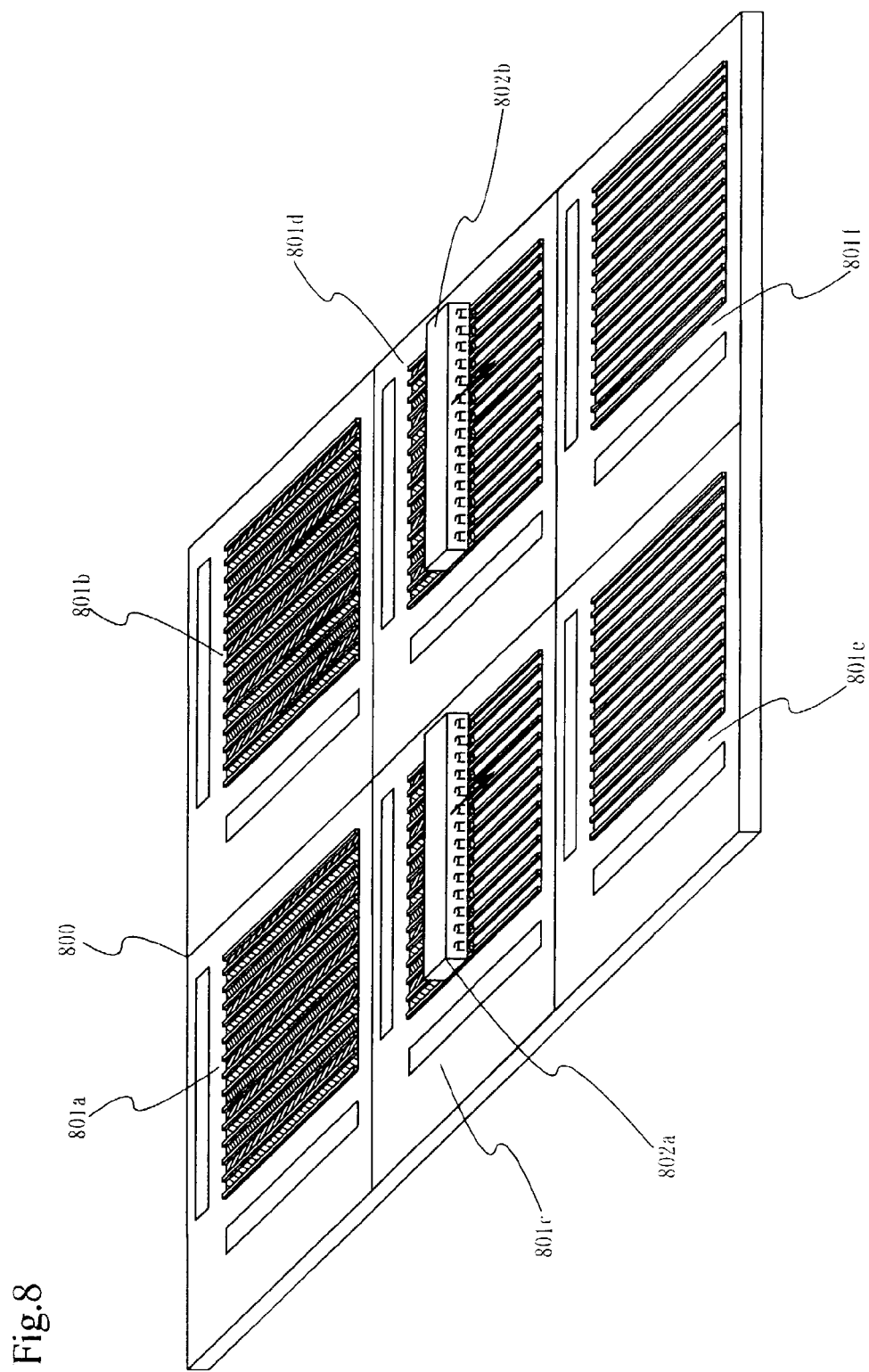
FIG. 8 is a diagram explaining a printing step of an organic compound layer to a substrate having a plurality of pixel regions.

FIG. 8 shows an embodiment in which the printing device of the present invention is applied to a panel portion formed on a large-area substrate (mother glass substrate). On a mother glass substrate 800, panels 801a to 801f each including a pixel region with the same structure as that in FIG. 6 are formed. Although two ink heads 802a and 802b are shown in FIG. 8, the number of ink heads can be arbitrarily set. In the case where the mixture is applied continuously over the adjacent pixel regions, the first and second piezoelectric elements are incorporated into the ink head and the timings for causing displacement are synchronized, whereby the mixture can be discharged continuously or the discharge can be stopped instantaneously, as described using FIGS. 3A and 3B and FIG. 4. Accordingly, the organic compound layer can be formed at high speed with respect to the large-area substrate on which a large number of pixel regions are formed.

Embodiment 4

Figure 9:
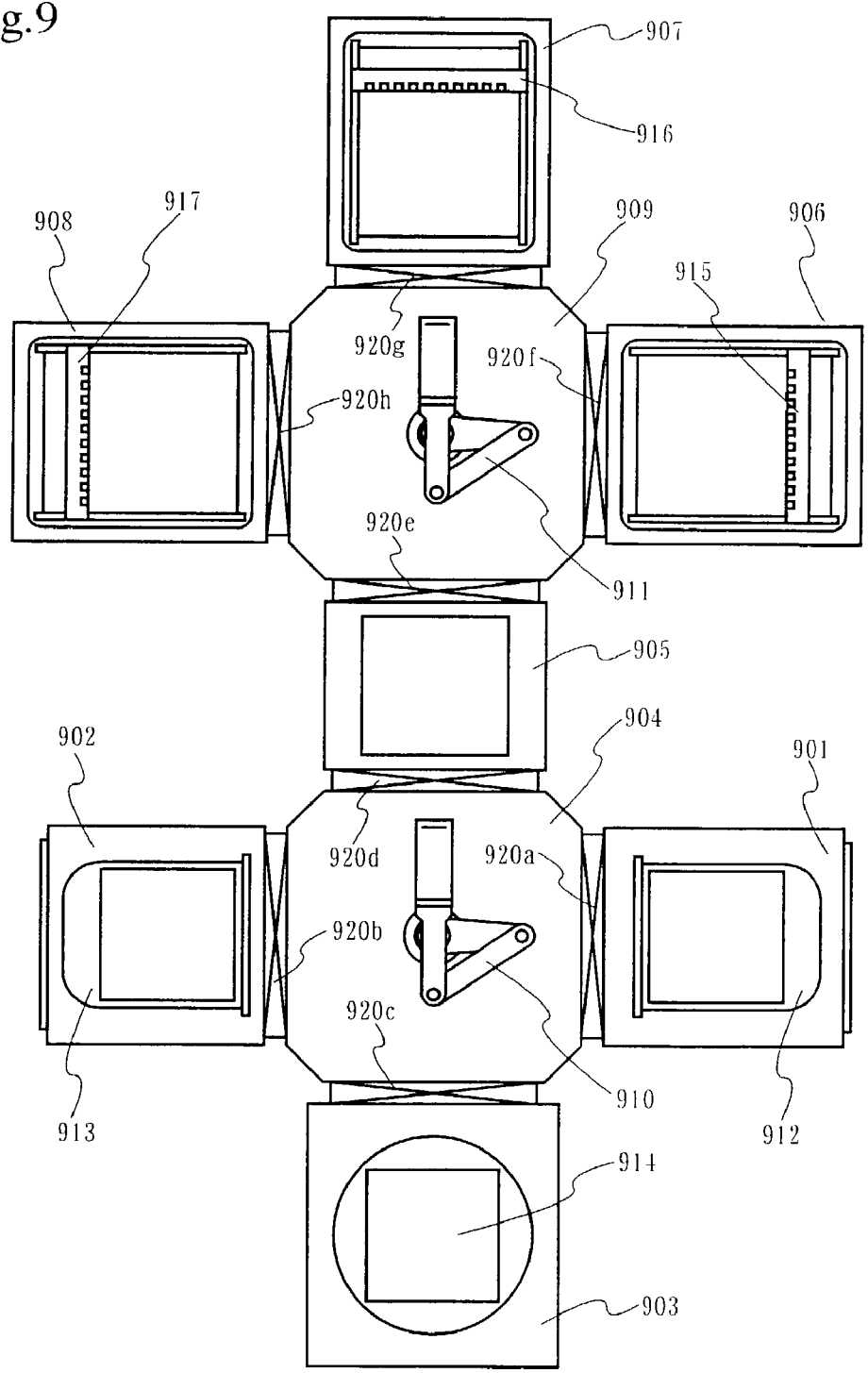
FIG. 9 is a diagram showing an example of a manufacturing device for forming a light emitting device.

FIG. 9 shows an example of a manufacturing device of a light emitting device, which is incorporated with a printing device according to the present invention. In FIG. 9, a plurality of printing chambers 906 to 908, a drying chamber 903, a load chamber 901, and an unload chamber 902 are provided and these are coupled by common chambers 904 and 909. An intermediate chamber 905 couples the common chambers 904 and 909. Conveyance of a substrate is conducted by conveying means 910 and 911. The printing chambers 906 to 908 are respectively provided with ink heads 915 to 917 each comprising the structure as FIG. 1 or 2.

The load chamber 901 and the unload chamber 902 respectively have cassettes 912 and 913 for holding a substrate. The drying chamber 903 is provided with a substrate stage incorporated with a sheathed heater, a lamp light source, or a heating means using warm air 914, which can heat and dry the substrate after printing.

The respective chambers are partitioned by gate valves 920a to 920h. Thus, printing is conducted in an inert gas or in the same kind of solvent atmosphere as the mixture, whereby impurity contamination can be prevented. A printing method does not require vacuum, and thus has a characteristic that the device structure becomes simple without vacuum pump, an airtight seal or the like.

Figure 10:
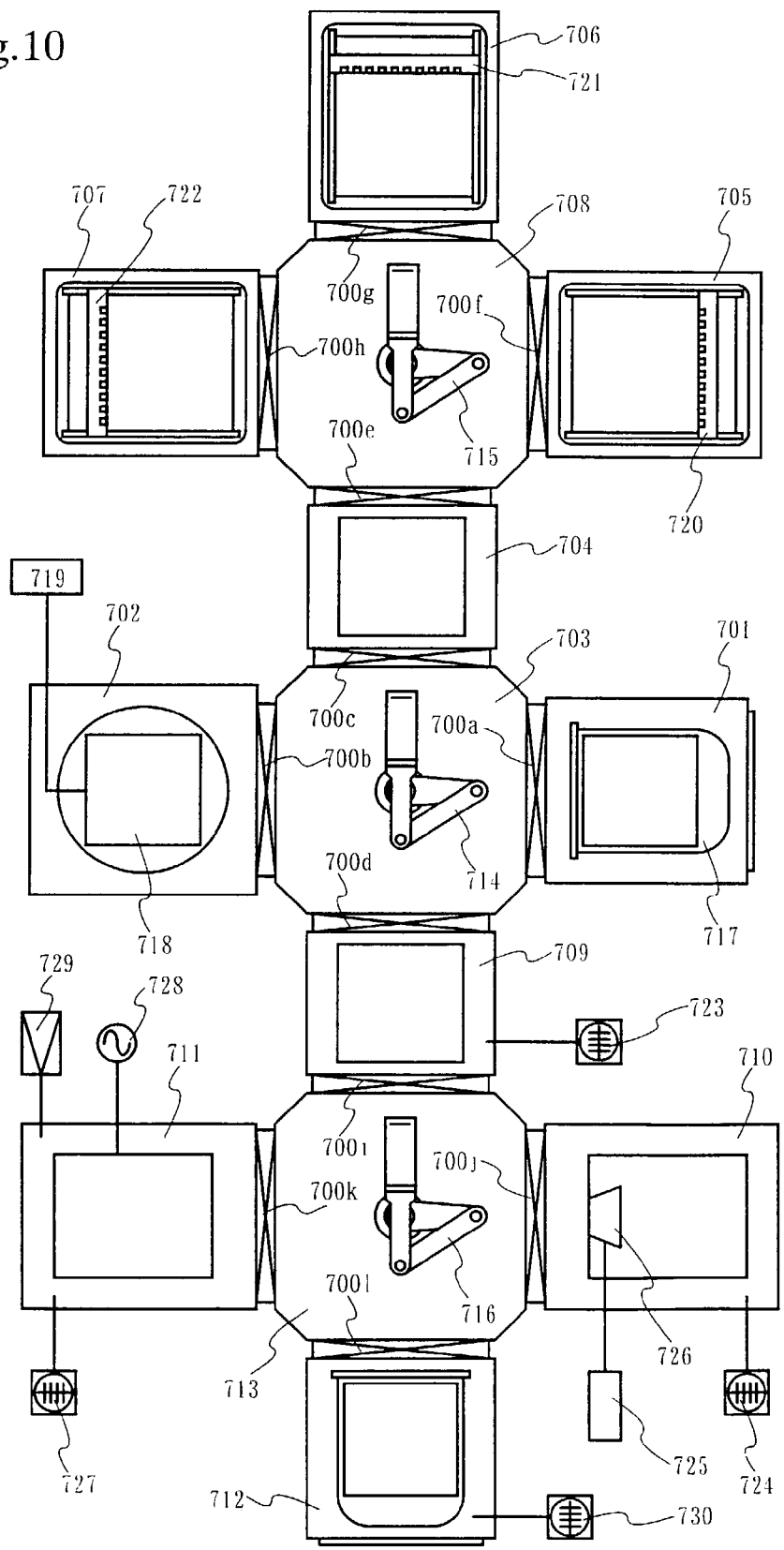
FIG. 10 is a diagram showing an example of a manufacturing device for forming a light emitting device.

FIG. 10 shows a structure of a device that enables continuous formation until forming an electrode of an organic light emitting element or a passivation film. Printing chambers 705 to 707 are respectively provided with ink heads 720 to 722 each comprising the same structure as that in FIG. 1 or 2. Cleaning of the substrate before printing is conducted in a cleaning chamber 702, and a cleaning means 718 conducts spin cleaning, brush cleaning or the like. A chemicals supply means 719 supplies an alkaline or acid cleaning fluid. The cleaning means 718 may also adopt UV cleaning using ultraviolet light. Conveyance of a substrate is conducted by conveying means 714 to 716.

Various kinds of processing are performed at an atmospheric pressure in a load chamber 701, the cleaning chamber 702, the printing chambers 705 to 707, common chambers 703, 708, and an intermediate chamber 704. On the other hand, processing is conducted under a reduced pressure in film forming chambers 710, 711 for forming a film, which are provided with exhaust means 724, 727, respectively. As the exhaust means, a dry pump, an oil rotary pump, a turbo molecular pump, a cryo pump, a mechanical booster pump or the like is applied. Therefore, an intermediate chamber 709, and an unload chamber 712 for temporarily holding the substrate after film formation are similarly provided with exhaust means 723 and 730. The respective chambers are partitioned by gate valves 700a to 700l.

The film forming chamber 710 conducts film formation of a conductive film by an evaporation method, and is provided with an evaporation source 726, a heating means 725 thereof and the like. The film forming chamber 711 is provided in order to form a film such as a silicon nitride film or a diamond-like carbon film by using a plasma CVD method. Therefore, the film forming chamber 711 is provided with a gas supply means 729, a glow discharge generation means 728 and the like. After an electrode is formed on an organic compound layer, a passivation film can be formed in succession. Thus, impurities can be prevented from mixing with the organic compound layer.

Embodiment 5

Figure 11:
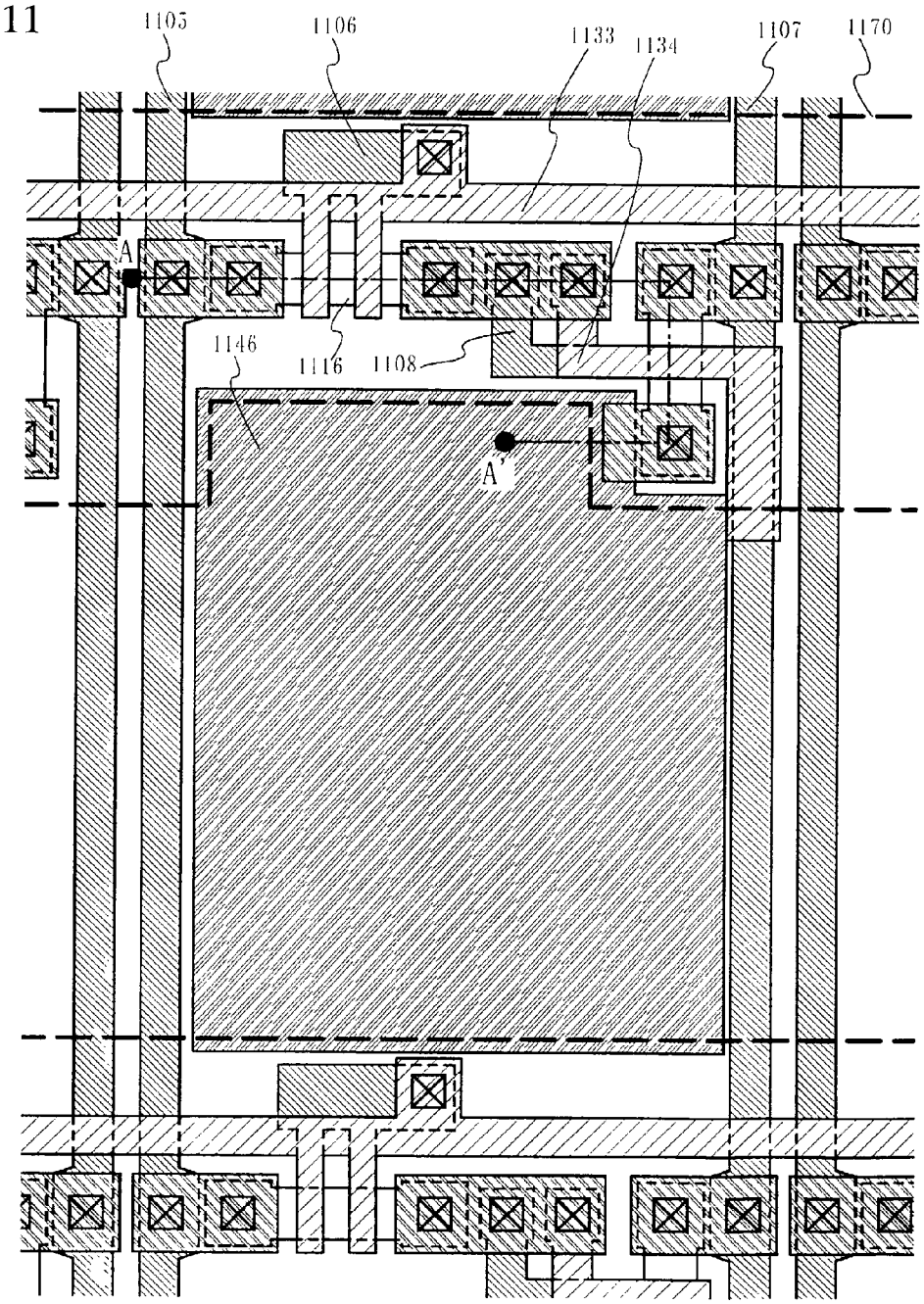
FIG. 11 is a top view explaining a structure of a pixel of an organic light emitting element.
Figure 12:
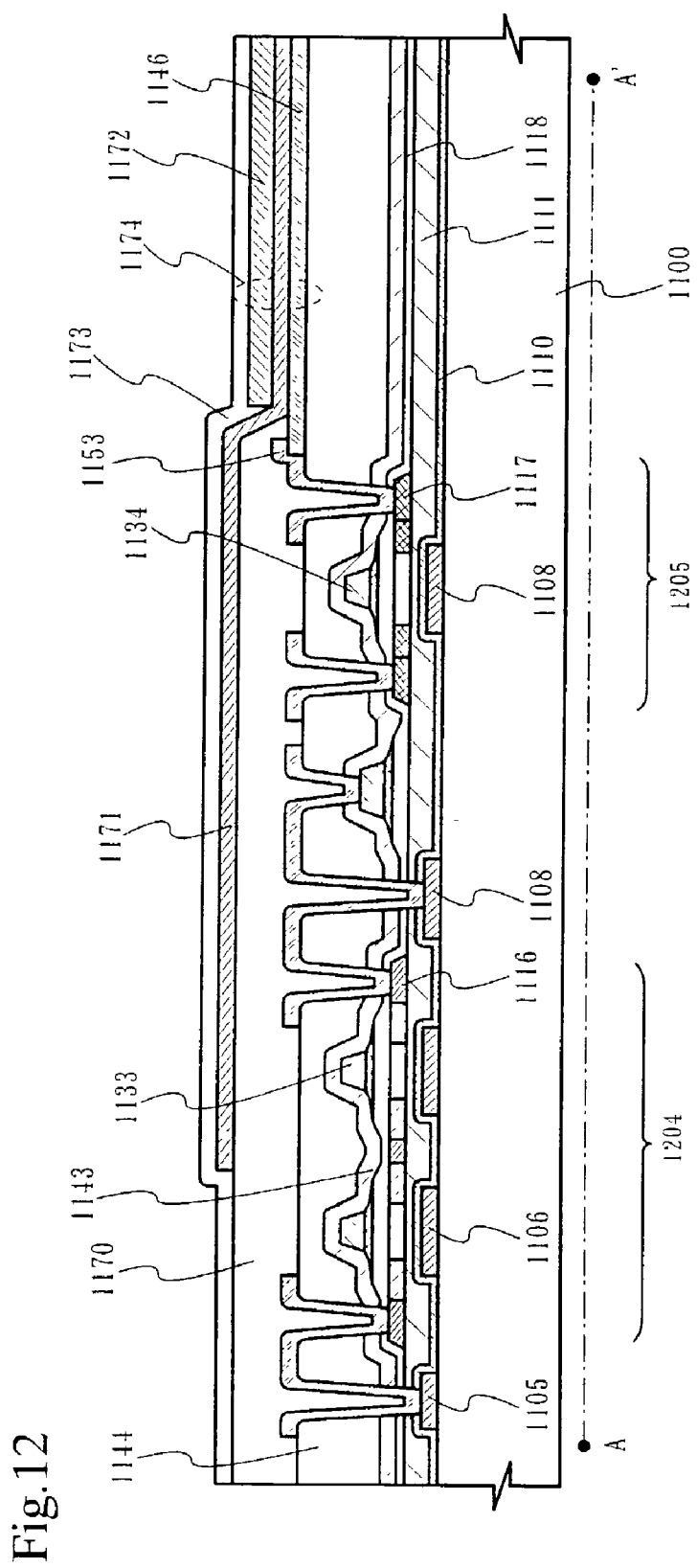
FIG. 12 is a sectional view explaining the structure of the pixel of the organic light emitting element.

FIG. 11 is a top view of an example of a structure of a pixel in an active matrix drive light emitting device. Further, FIG. 12 is a sectional view taken along a line A–A' in FIG. 11. In both the figures, the pixel structure is described using common reference numerals.

In the pixel structure, two TFTs are provided in one pixel, one of the TFTs is an n-channel TFT 1204 for conducting a switching operation, and the other is a p-channel TFT 1205 for controlling an electric current that is made to flow through an organic light emitting element. A wiring 1105 is a signal line based on image data, and a wiring 1107 is a power source supply line for supplying an electric current to an organic light emitting element. Of course, when the present invention is applied, there is no limitation on the number of TFTs provided in one pixel, and an appropriate circuit structure may be adopted in accordance with a drive system of a light emitting device.

As shown in FIG. 12, an organic light emitting element 1174 is constituted of a first electrode 1146, an organic compound layer 1171 and a second electrode 1172. The first electrode and the second electrode can be distinguished into an anode and a cathode in accordance with the polarity. A material with a high work function such as indium oxide, tin oxide or zinc oxide is used as a material for forming the anode. A material with a low work function, which is comprised of alkali metal or alkaline earth metal such as MgAg, AlMg, Ca, Mg, Li, AlLi or AlLiAg, typically a magnesium compound is used for the cathode.

A passivation film 1173 is formed thereon. The passivation film is formed by using a material which has a high barrier property against oxygen and vapor, such as silicon nitride, silicon oxynitride or diamond-like carbon.

In the p-channel TFT 1205 and the n-channel TFT 1204, active layers 1116 and 1117 each comprising a channel forming region, source and drain regions, an LDD region and the like are formed, are formed of a polycrystalline semiconductor film. While first gate electrodes 1133, 1134 are formed through a gate insulating film 1118, second gate electrodes 1106, 1108 opposing the first gate electrodes with the active layer therebetween are provided through insulating films 1110, 1111. Interlayer insulating films 1143, 1144 are formed by a combination of an inorganic insulating film and an organic insulating film.

The first electrode 1146 of the organic light emitting element is connected with an electrode 1153 of the p-channel TFT 1205. A partition wall 1170 is formed in order to separate adjacent pixels from each other, and partition the pixels so that a mixture does not extend to the adjacent pixel when an organic compound layer is formed by an ink jet method. The partition wall 1170 is formed from a photosensitive or thermosetting resin material such as polyimide or acrylic so as to cover an end portion of the first electrode. The organic compound layer may be formed in a longitudinal direction or a horizontal direction.

The organic compound layer is formed in succession between a pair of partition walls by using an ink jet printing device. The ink head with the structure shown in FIGS. 1 or 2 is used.

Figure 14A:
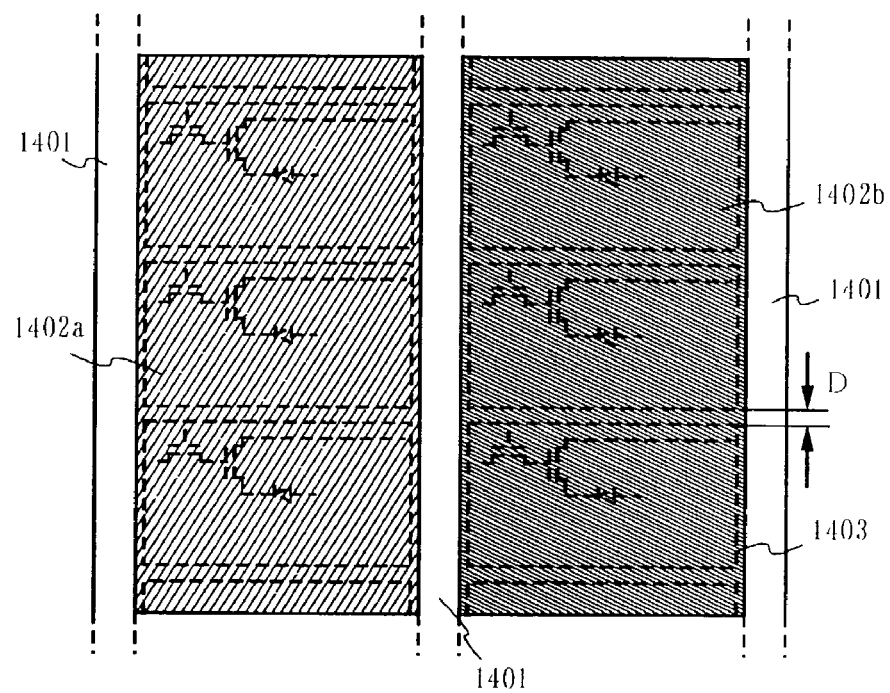
FIGS. 14A and 14B are top views showing an embodiment in which an organic compound layer is formed in a pixel region of an organic light emitting element.
Figure 14B:
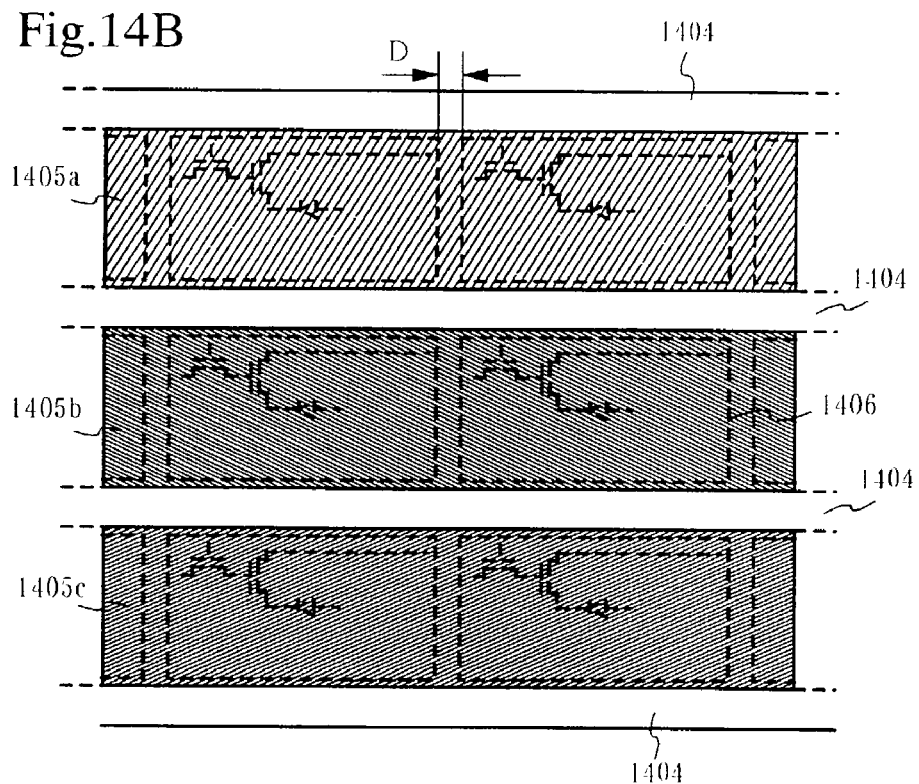

In the case where the organic compound layer is formed in the longitudinal direction, the arrangement shown in FIG. 14A is obtained. In the case where the organic compound layer is formed in the horizontal direction, the arrangement shown in FIG. 14B is obtained. In FIG. 14A, reference numeral 1401 indicates a stripe-shaped partition wall formed in the longitudinal direction, 1402a indicates an organic compound layer for emitting red light, and 1402b indicates an organic compound layer for emitting green light. Of course, an organic compound layer for emitting blue light (not shown) is formed adjacently with the organic compound layer for emitting green light 1402b. Note that the partition wall 1401 is formed above and along a source wiring through an insulating film.

At this time, a distance D between pixels 1403 indicated by dotted lines is desirably five times of a thickness (t) of the organic compound layer or more (preferably, ten times or more). This is because the problem of crosstalk between the pixels may arise with D<5t. Incidentally, a high-definition image can not be obtained when the distance D is too long, and thus, 5t<D<50t (preferably, 10t<D<35t) is preferable. Further, in FIG. 14B, reference numeral 1404 indicates a stripe-shaped partition wall formed in the horizontal direction, 1405a indicates an organic compound layer for emitting red light, 1405b indicates an organic compound layer for emitting green light, and 1405c indicates an organic compound layer for emitting blue light. Incidentally, the partition wall 1404 is formed above and along a gate wiring through an insulating film. In this case as well, a distance D between pixels 1401 indicated by dotted lines is preferably five times of the thickness t of the organic compound layer or more (preferably, 10 times or more), and more preferably 5t<D<50t (preferably, 10t<D<35t).

Embodiment 6

Figure 13A:
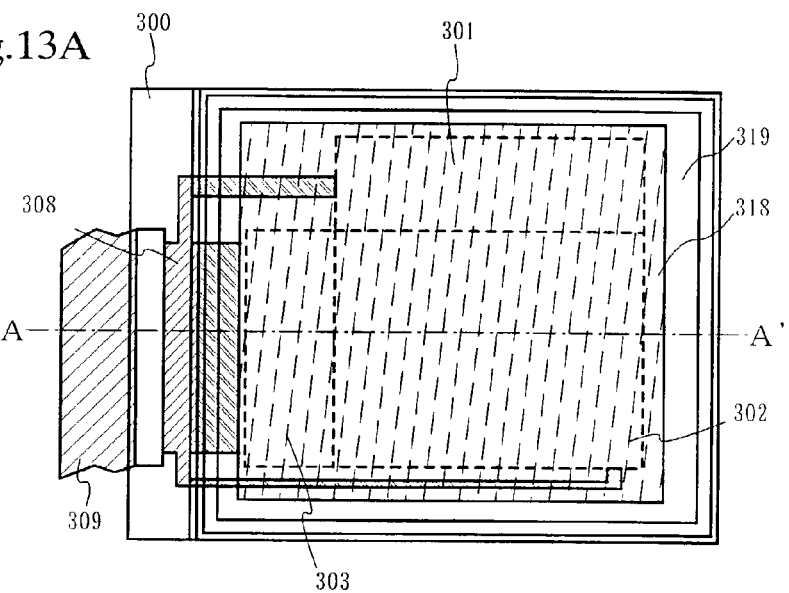
FIGS. 13A and 13B are a top view and a sectional view showing a structure of a light emitting device, respectively.
Figure 13B:
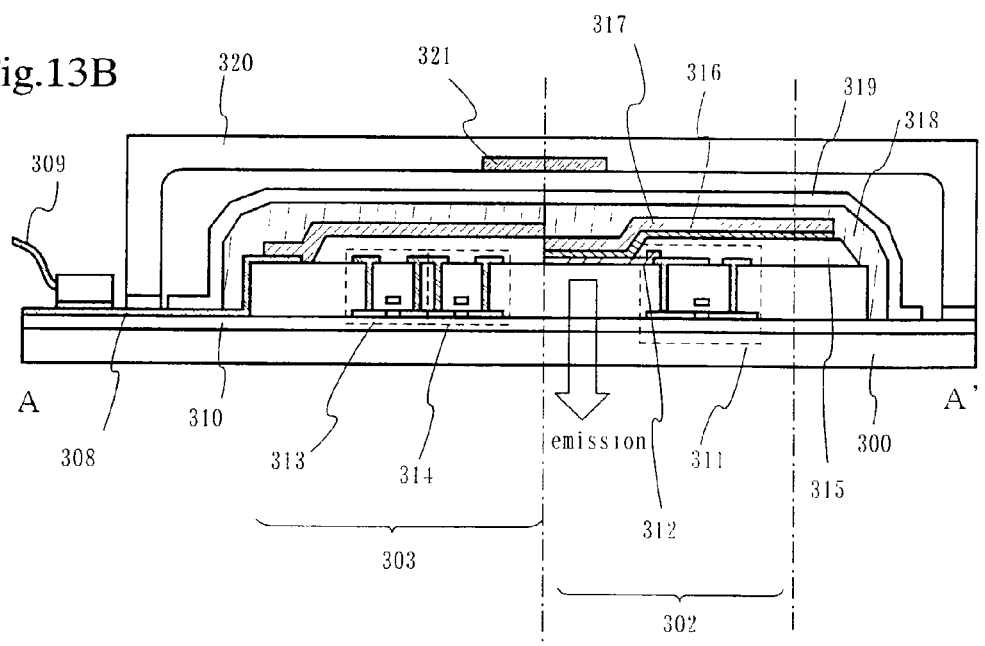

In this embodiment, FIGS. 13A and 13B show an example in which a light emitting device provided with an organic light emitting element is manufactured. FIG. 13A is a top view of the light emitting device, and FIG. 13B is a sectional view taken along a line A–A' in FIG. 13A. On a substrate 300 with an insulating surface (for example, a glass substrate, a crystalline glass substrate, or a plastic substrate), a pixel region 302, a source side driver circuit 301, and a gate side driver circuit 303 are formed. Organic compound layers in the pixel regions are formed by using the ink jet printing device of the present invention in accordance with the above-described embodiments. Further, known TFTs and circuit technique may be applied to the driver circuits.

Reference numeral 318 indicates a sealing member, and 319 indicates a protective film. The pixel portion and the driver circuits are covered with the sealing member 318, and the sealing member is covered with protective film 319 and sealed by a cover member 320 using an adhesive. It is desirable that the cover member 320 is formed by using the same material as that for the substrate 300, for example, a glass substrate in order to withstand deformation due to heat, external force, or the like. The cover member 320 is processed to have a concave shape (with a depth of 3 to 10 μm) shown in FIG. 13B by sandblasting or the like. It is desirable that the cover member 320 is further processed to form a concave portion (with a depth of 50 to 200 μm) into which a drying agent 321 can be arranged. Incidentally, reference numeral 308 indicates a wiring for transmitting signals input to the source side driver circuit 301 and the gate side driver circuit 303, and the wiring receives a video signal and a clock signal from an FPC (flexible printed circuit) that is an external input terminal.

Next, the sectional structure is described with reference to FIG. 13B. An insulating film 310 is provided on the substrate 300, and the pixel region 302 and the gate side driver circuit 303 are formed above the insulating film 310. The pixel region 302 is constituted of a plurality of pixels including a current control TFT 311 and one electrode 312 of a light emitting element electrically connected to a drain of the current control TFT 311. Further, the gate side driver circuit 303 is formed by using a CMOS circuit in which an n-channel TFT 313 and a p-channel TFT 314 are combined. These TFTs (including 311, 313, and 314) may be manufactured in accordance with a known technique.

The pixel electrode 312 functions as an anode of an organic light emitting element. Also, partition walls 315 are formed at both ends of the pixel electrode 312, and an organic compound layer 316 and a cathode 317 of the organic light emitting element are formed on the electrode 312 of the light emitting element. The organic compound layer 310 may be formed by freely combining a light emitting layer, a charge transporting layer, a charge injecting layer, and the like.

For example, as described in Embodiment 1, a first organic compound layer comprised of PEDOT can be formed as a hole injecting layer, and a second organic compound layer can be formed thereon by using the ink jet printing device of the present invention. In this case, the second organic compound layer becomes a light emitting layer. A polymer or intermediate molecular weight organic compound material may be applied, and the specific example is shown in Embodiment 1.

The cathode 317 also functions as a common wiring to all the pixels, and is electrically connected to an FPC 309 through a connection wiring 308. Further, all the elements included in the pixel region 302 and in the gate side driver circuit 303 are covered by the cathode 317, the sealing member 318 and the protective film 319. After the organic light emitting element is completely covered by the sealing member 318, at least the protective film 319 comprised of a diamond-like carbon (DLC) film or the like is preferably provided on the surface (exposed surface) of the sealing member 318 as shown in FIGS. 13A and 13B. Also, the protective film may be provided on the entire surface including the rear surface of the substrate. Here, attention has to be paid so that the protective film is not formed at the part where the external input terminal (FPC) is provided. The protective film may not be formed there by using a mask. Alternatively, the protective film may not be formed by covering the external input terminal portion with a masking tape.

The organic light emitting element is sealed by the sealing member 318 and the protective film 319 with the above-described structure, whereby the organic light emitting element can be completely shut from the outside. Thus, substances that promote deterioration of the organic compound layer due to oxidization, such as moisture and oxygen, can be prevented from entering the organic light emitting element. Therefore, a light emitting device with high reliability can be obtained. In addition, the structure may be adopted in which a pixel electrode is a cathode, and an organic compound layer and an anode are laminated to provide light emission in a reverse direction to that in FIG. 13B.

Embodiment 7

The light emitting device fabricated in accordance with the present invention is of the self-emission type, and thus exhibits more excellent recognizability of the displayed image in a light place. Furthermore, the light emitting device has a wider viewing angle. Accordingly, the light emitting device can be applied to a display portion in various electronic devices. For example, in order to view a TV program or the like on a large-sized screen, the light emitting device in accordance with the present invention can be used as a display portion for a TV set having a diagonal size of 30 inches or larger (typically 40 inches larger) and an image monitor device (i.e., a display in which a light emitting device is installed into a frame).

The image monitor device includes all kinds of displays to be used for displaying information, such as a display for a personal computer, a display for receiving a TV broadcasting program, a display for advertisement display. Moreover, the light emitting device in accordance with the present invention can be used as a display portion of other various electric devices.

Such electronic devices include a video camera, a digital camera, a goggles-type display (head mount display), a navigation system, a sound reproduction device (a car audio, an audio equipment, and the like), a lap-top personal computer, a game machine a portable information terminal (a mobile computer, a portable telephone, a portable game machine, an electronic book, or the like), an image reproduction apparatus including a recording medium (more specifically, an apparatus which can reproduce a recording medium such as a digital video disc (DVD), and includes a display for displaying the reproduced image), or the like. In particular, in the case of the portable information terminal, use of the light emitting device is preferable, since the portable information terminal that is likely to be viewed from a tilted direction is often required to have a wide viewing angle. FIGS. 15A to 16B respectively show various specific examples of such electronic devices.

Figure 15A:
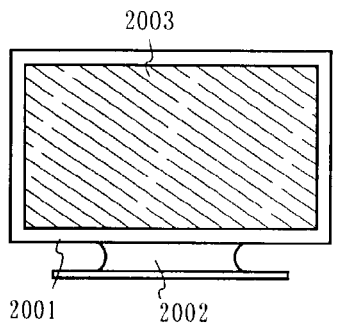
FIGS. 15A to 15F are diagrams showing examples of electronic devices which are completed by using the light emitting device manufactured by using the present invention.

FIG. 15A illustrates a TV set or an image monitor which includes a frame 2001, a support table 2002, a display portion 2003, or the like. The light emitting device in accordance with the present invention is applicable to the display portion 2003. The TV set or the image monitor is of the self-emission type and therefore requires no back light. Thus, the display portion thereof can have a thickness thinner than that of the liquid crystal display device.

Figure 15B:
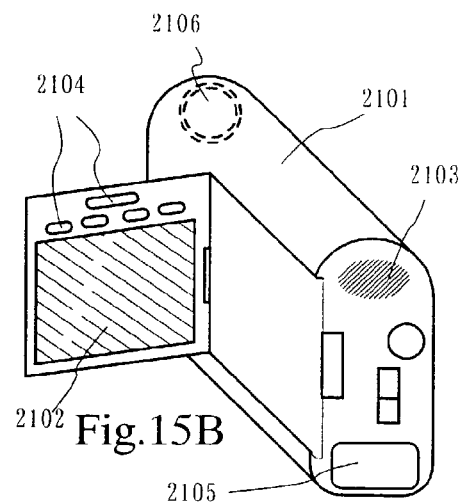

FIG. 15B illustrates a video camera which includes a main body 2101, a display portion 2102, an audio input portion 2103, operation switches 2104, a battery 2105, an image receiving portion 2106, or the like. The light emitting device in accordance with the present invention can be used as the display portion 2102.

Figure 15C:
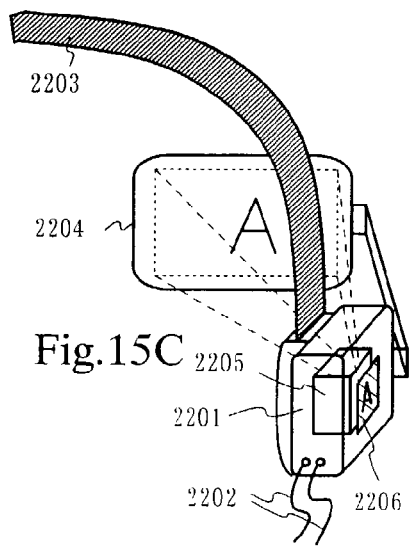

FIG. 15C illustrates a portion (the right-half piece) of a display of head mount type, which includes a main body 2201, signal cables 2202, a head mount band 2203, a display portion 2204, an optical system 2205, a light emitting device 2206, or the like. The light emitting device in accordance with present invention is applicable to the display device 2204.

Figure 15D:
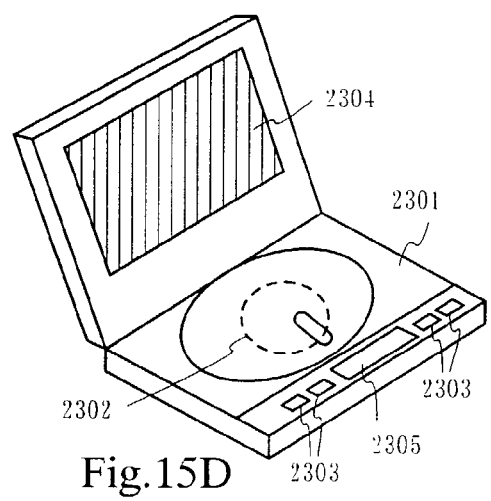

FIG. 15D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The light emitting device in accordance with the present invention can be used as these display portions (a) and (b). The image reproduction apparatus including a recording medium further includes a game machine or the like.

Figure 15E:
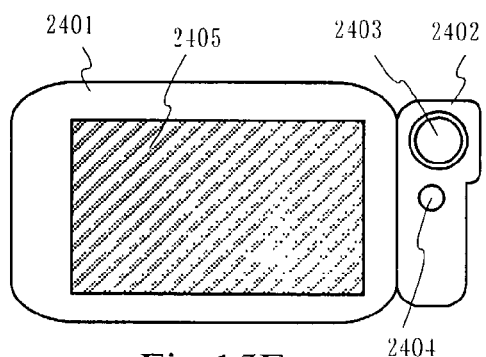

FIG. 15E illustrates a portable (mobile) computer which includes a main body 2401, a camera portion 2402, an image receiving portion 2403, operation switches 2404, a display portion 2405, or the like. The light emitting device in accordance with the present invention can be used as the display portion 2405.

Figure 15F:
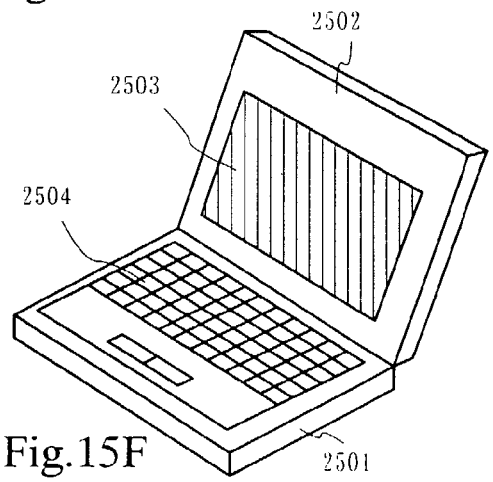

FIG. 15F illustrates a personal computer which includes a main body 2501, a frame 2502, a display portion 2503, a key board 2504, or the like. The light emitting device in accordance with the present invention can be used as the display portion 2503.

The aforementioned electronic devices are more likely to be used for display information distributed through a telecommunication path such as Internet, a CATV (cable television system) and the like, and in particular likely to display moving picture information. The light emitting device is suitable for displaying moving pictures since the organic light emitting material can exhibit high response speed. However, if the contour between the pixels becomes unclear, the moving pictures as a whole cannot be clearly displayed. Since the light emitting device in accordance with the present invention can make the contour between the pixels clear, it is significantly advantageous to apply the light emitting device of the present invention to a display portion of the electronic devices.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

With now reference to FIG. 10A, a portable telephone is illustrated, which includes a main body 2601, an audio output portion 2602, an audio input portion 2603, a display portion 2604, operation switches 2605, and an antenna 2606. The light emitting device in accordance with the present invention can be used as the display portion 2604. The display portion 2604 can reduce power consumption of the portable telephone by displaying white-colored characters on a black-colored background.

Figure 16A:
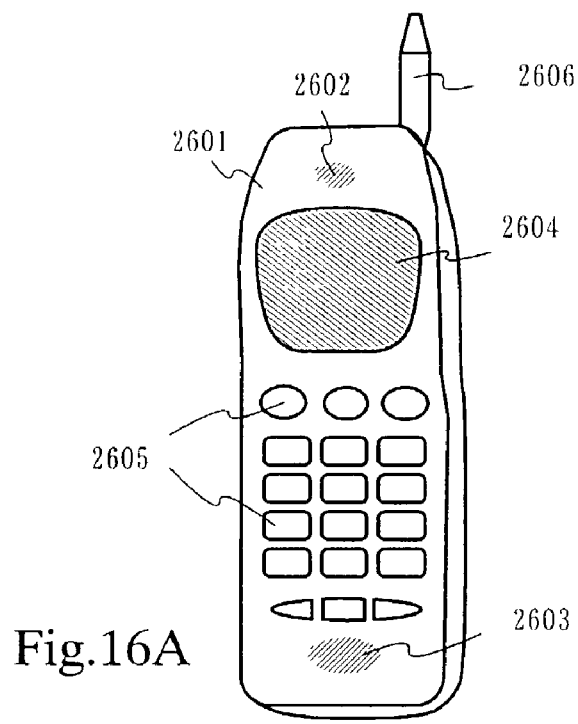
FIGS. 16A and 16B are diagrams showing examples of electronic devices which are completed by using the light emitting device manufactured using the present invention.
Figure 16B:
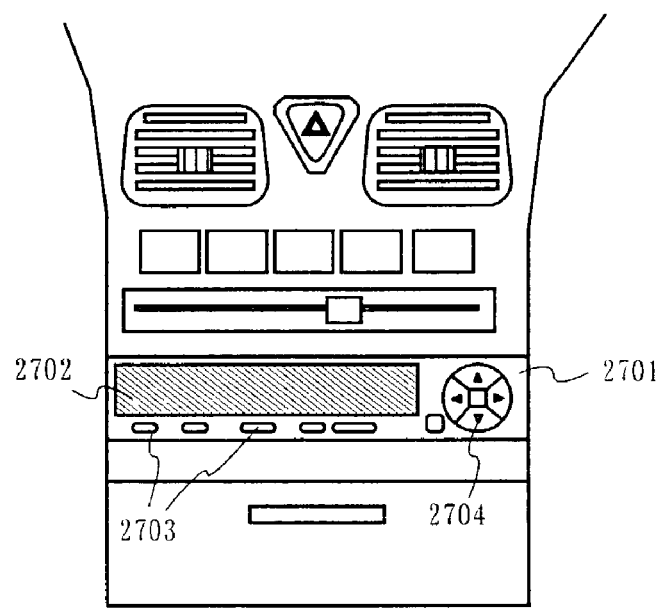

FIG. 16B illustrates a sound reproduction device, a car audio equipment in concrete term, which includes a main body 2701, a display portion 2702, and operation switches 2703 and 2704. The light emitting device in accordance with the present invention can be used as the display portion 2702. Although the car audio equipment of the mount type is shown in this embodiment, the present invention is also applicable to a portable type and a domestic type sound reproduction device. The display portion 2702 can reduce power consumption by displaying white-colored characters on a black-colored background, which is particularly advantageous for the audio of the portable type.

As set forth above, the present invention can be applied variously to a wide range of electronic devices in all fields.

As described above, in the printing device of the present invention, the first and second piezoelectric elements are incorporated into the ink head, and the timings for causing displacement are synchronized. Thus, the mixture can be discharged continuously, and the discharge can be stopped instantaneously. Therefore, time for position control in printing the organic compound layer is shortened, and the printing speed can he increased.

Such printing device is applied for manufacturing the light emitting device, whereby processing time which is necessary for forming the organic compound layer can be shortened. In particular, the printing device is appropriately applied to the production method in which a plurality of display panels are taken out from one large-area substrate. In the case where the plurality of pixel regions are provided in the large-area substrate, the discharge of the mixture is stopped instantaneously during the movement of the ink head between the pixel regions, whereby the ink head can be moved at higher speed to the large-area substrate. The second piezoelectric element is provided in order to stop the discharge of the mixture instantaneously, whereby the high speed in printing can be realized.

What is claimed is:

1. A method of manufacturing a light emitting device for forming an organic compound layer by an ink jet method, comprising:
    a first stage of forming a stripe-shaped organic compound layer in a pixel region by continuously dropping a mixture from an ink head due to a vibration of a first piezoelectric element; and
    a second stage of instantaneously stopping the drop of the mixture, comprising the steps of:
    stopping the vibration of the first piezoelectric element;
    operating a second piezoelectric element;
    continuing operating the second piezoelectric element while the first piezoelectric element is stopped; and
    stopping the operation of the second piezoelectric element.

2. A method of manufacturing a light emitting device according to claim 1, wherein the mixture is a solution in which an organic light emitting material or a precursor thereof is dissolved or dispersed in a liquid.

3. A method of manufacturing a light emitting device for forming an organic compound layer by an ink jet method, comprising:
    a first stage of forming a stripe-shaped organic compound layer in a pixel region by continuously dropping a mixture from an ink head due to a vibration of a first piezoelectric element for application of the mixture and spraying gas to the application surface for leveling of the application surface; and
    a second stage of instantaneously stopping the drop of the mixture, comprising steps of:
    stopping the vibration of the first piezoelectric element;
    operating a second piezoelectric element;
    continuing operating the second piezoelectric element while the first piezoelectric element is stopped; and
    stopping the operation of the second piezoelectric element.

4. A method of manufacturing a light emitting device according to claim 3, wherein the mixture is a solution in which an organic light emitting material or a precursor thereof is dissolved or dispersed in a liquid.

5. A method of manufacturing a light emitting device, comprising steps of:
    forming a first organic compound layer by an application method; and
    forming a second organic compound layer on the first organic compound layer by an ink jet method,
    wherein the step of forming the second organic compound layer comprises:
        first stage of forming a stripe-shaped organic compound layer in a pixel region by continuously dropping a mixture from an ink head due to a vibration of a first piezoelectric element; and
        a second stage of instantaneously stopping the drop of the mixture, comprising steps of:
    stopping the vibration of the first piezoelectric element;
    operating a second piezoelectric element;
    continuing operating the second piezoelectric element while the first piezoelectric element is stopped; and
    stopping the operation of the second piezoelectric element.

6. A method of manufacturing a light emitting device according to claim 5, wherein the first organic compound layer is formed from polyethylene dioxythiophene.

7. A method of manufacturing a light emitting device according to claim 5, wherein the mixture is a solution in which an organic light emitting material or a precursor thereof is dissolved or dispersed in a liquid.

8. A method of manufacturing a light emitting device, comprising steps of:
    forming a first organic compound layer by an application method; and
    forming a second organic compound layer on the first organic compound layer by an ink jet method,
    wherein the step of forming the second organic compound layer comprises:
        a first stage of forming a stripe-shaped organic compound layer in a pixel region by continuously dropping a mixture from an ink head due to a vibration of a first piezoelectric element for application of the mixture and spraying gas to the application surface for leveling of the application surface; and a second stage of instantaneously stopping the drop of the mixture, by comprising steps of:

stopping the vibration of the first piezo electric element;

operating a second piezoelectric element;

continuing operating the second piezoelectric element while the first piezoelectric element is stopped; and stopping the operation of the second piezoelectric element.

9. A method of manufacturing a light emitting device according to claim 8, wherein the first organic compound layer is formed from polyethylene dioxythiophene.

10. A method of manufacturing a light emitting device according to claim 8, wherein the mixture is a solution in which an organic light emitting material or a precursor thereof is dissolved or dispersed in a liquid.

* * * * *